United States Patent
Rouat

(10) Patent No.: US 9,473,097 B2
(45) Date of Patent: Oct. 18, 2016

(54) RESISTIVE LADDER

(71) Applicant: STMicroelectronics SA, Montrouge (FR)

(72) Inventor: Emmanuel Rouat, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 95 days.

(21) Appl. No.: 14/515,342

(22) Filed: Oct. 15, 2014

(65) Prior Publication Data

US 2015/0109057 A1  Apr. 23, 2015

(30) Foreign Application Priority Data

Oct. 22, 2013  (FR) ...................................... 13 60285

(51) Int. Cl.
| | |
|---|---|
| H03F 1/34 | (2006.01) |
| H03G 3/30 | (2006.01) |
| H03F 3/45 | (2006.01) |
| H03G 1/00 | (2006.01) |
| H03G 3/00 | (2006.01) |

(52) U.S. Cl.
CPC ............ *H03G 3/30* (2013.01); *H03F 3/45071* (2013.01); *H03G 1/0088* (2013.01); *H03G 3/001* (2013.01); *H03F 2203/45178* (2013.01); *H03F 2203/45202* (2013.01); *H03F 2203/45336* (2013.01); *H03F 2203/45528* (2013.01)

(58) Field of Classification Search
CPC .................................... H03F 1/34; H03L 7/00

USPC ............................................................. 330/86
See application file for complete search history.

(56) References Cited

U.S. PATENT DOCUMENTS

| | | | | |
|---|---|---|---|---|
| 6,445,248 | B1* | 9/2002 | Gilbert ............................ | 330/51 |
| 7,304,596 | B2* | 12/2007 | Lin et al. ...................... | 341/145 |
| 7,345,611 | B2* | 3/2008 | Voicu et al. .................. | 341/145 |
| 8,471,609 | B1* | 6/2013 | Wright .......................... | 327/143 |
| 8,497,735 | B2* | 7/2013 | Gilbert .......................... | 330/254 |
| 8,994,446 | B2* | 3/2015 | Pietri et al. ................... | 327/534 |
| 2005/0052305 | A1 | 3/2005 | Voicu et al. | |
| 2006/0261991 | A1 | 11/2006 | Lin et al. | |

FOREIGN PATENT DOCUMENTS

| | | |
|---|---|---|
| JP | 58-6607 A | 1/1983 |
| JP | 64-19812 A | 1/1989 |
| JP | 2002-252536 A | 9/2002 |

* cited by examiner

*Primary Examiner* — Henry Choe
(74) *Attorney, Agent, or Firm* — Seed IP Law Group PLLC

(57) ABSTRACT

A resistive ladder has first, second and third resistors coupled in series between first and second voltage terminals. A first node of the first resistor is coupled to the first voltage terminal and a first node of the third resistor is coupled to the second voltage terminal. A voltage selection unit has a first input coupled to a first node of the second resistor and a second input coupled to a second node of the second resistor and is adapted to selectively couple one of the first and second inputs to an output node of said resistive ladder. The resistive ladder also includes a first switch coupled between a second node of the third resistor and the second voltage terminal.

23 Claims, 3 Drawing Sheets

RESISTIVE LADDER

CROSS REFERENCE TO RELATED APPLICATION

This application claims the priority benefit of French Patent Application number 13/60285, filed on Oct. 22, 2013, the contents of which is hereby incorporated by reference in entirety to the maximum extent allowable by law.

FIELD

The present application relates to the field of resistive ladders, and also to a resistive ladder of a programmable amplifier circuit.

BACKGROUND

Amplifiers having a programmable gain are known in the art. For example, in an amplifier circuit formed of an operational amplifier with negative feedback, the gain of the amplifier is a function of the resistance in the feedback path. It has been proposed to use a resistive ladder to provide a potential divider in the feedback path of such an amplifier, such that by setting the output level of the potential divider, the gain of the amplifier can be programmed.

However, a drawback of existing resistive ladder circuits is that performance is poor and/or the circuits are complex, leading to a relatively high manufacturing cost and large silicon area.

There is thus a need in the art for an improved resistive ladder circuit.

SUMMARY

It is an aim of embodiments of the present disclosure to at least partially address one or more needs in the prior art.

According to one aspect, there is provided a resistive ladder comprising: at least first, second and third resistors, coupled in series between first and second voltage terminals, a first node of the first resistor being coupled to the first voltage terminal and a first node of the third resistor being coupled to the second voltage terminal; a voltage selection unit having a first input coupled to a first node of the second resistor and a second input coupled to a second node of the second resistor, wherein the voltage selection unit is adapted to selectively couple one of the first and second inputs to an output node of the resistive ladder; and a first switch coupled between a second node of the third resistor and the second voltage terminal.

According to one embodiment, the second resistor has the same resistance as the third resistor within a 5 percent tolerance.

According to one embodiment, the resistive ladder further comprises: a fourth resistor coupled in series with the first, second and third resistors and having a first node coupled to the second resistor and a second node coupled to the third resistor; and a second switch coupled between the first node of the fourth resistor and the second voltage terminal.

According to one embodiment, the resistive ladder comprises at least one further resistor coupled between the second and fourth resistors.

According to one embodiment, the resistive ladder further comprises a control circuit adapted to generate one or more control signals for controlling the voltage selection unit and the first switch.

According to one embodiment, the voltage selection unit comprises a multiplexer having a selection input receiving the one or more control signals.

According to one embodiment, the control circuit is adapted to select one of: a first voltage level of the resistive ladder by controlling the voltage selection unit to couple the first node of the second resistor to the output node and activating the first switch; and a second voltage level of the resistive ladder by controlling the voltage selection unit to couple the second node of the second resistor to the output node and deactivating the first switch.

According to a further aspect, there is provided an integrated circuit comprising the above resistive ladder.

According to a further aspect, there is provided a programmable gain amplifier comprising the above resistive ladder; a differential amplifier having a positive input node coupled to an input voltage node, an output node coupled to the first voltage terminal of the resistive ladder, and a negative input node coupled to the output node of the resistive ladder.

According to a further aspect, there is provided a method comprising: selecting, by a control circuit, a voltage level of a resistive ladder having at least first, second and third resistors coupled in series between first and second voltage terminals, a first node of the first resistor being coupled to the first voltage terminal and a first node of the third resistor being coupled to the second voltage terminal, wherein the voltage level is selected by: selectively coupling one of first and second nodes of the second resistor to an output node of the resistive ladder; and selectively activating a first switch coupled between a second node of the third resistor and the second voltage terminal.

According to one embodiment, selecting the voltage level comprises selecting one of: a first voltage level by coupling the first node of the second resistor to the output node and activating the first switch; and a second voltage level by coupling the second node of the second resistor to the output node and deactivating the first switch.

According to a further aspect, there is provided a method of programming the gain of an amplifier circuit comprising selecting a voltage level of a resistive ladder according to the above method.

BRIEF DESCRIPTION OF THE DRAWINGS

The foregoing and other features and benefits will become apparent from the following detailed description of embodiments, given by way of illustration and not limitation with reference to the accompanying drawings, in which.

DETAILED DESCRIPTION

While in the following description an application of a resistive ladder in a programmable amplifier circuit is described, there are other possible applications of the resistive ladder, such as for the generation of reference voltages, the generation of regulated supply voltages, or as part of a digital-to-analog converter (DAC).

Figure 1:
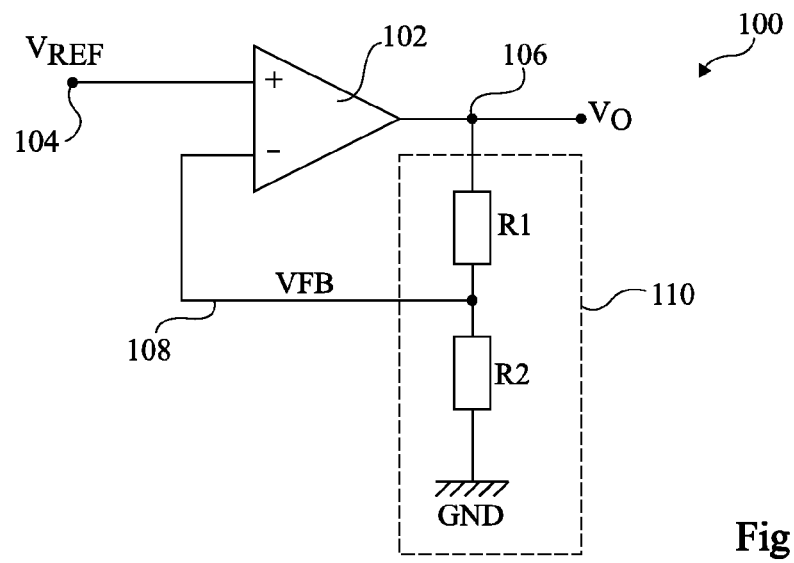
FIG. 1 schematically illustrates an amplifier circuit with negative feedback according to an example application of embodiments of the present disclosure.

FIG. 1 schematically illustrates a programmable amplifier circuit 100 according to an example embodiment.

Circuit 100 comprises a differential amplifier 102, which is for example an operational amplifier. The differential amplifier 102 has a positive input 104 coupled to an input voltage node providing the input voltage that is to be amplified. In one embodiment, the input voltage is a reference voltage $V_{REF}$, such as a supply voltage level, which is to be adjusted, and the amplifier circuit provides the function of an output regulator.

The differential amplifier 102 provides, at an output 106, an output voltage $V_O$. A feedback path is provided between the output 106 and a negative input 108 of the differential amplifier 102, the feedback path comprising a potential divider 110 that divides the voltage $V_O$ to provide a feedback voltage VFB. The potential divider has a resistance R1 between the output 106 and the negative input 108 of the differential amplifier, and a resistance R2 between the negative input 108 of the differential amplifier and a ground voltage. The gain of the amplifier circuit is thus:

$$V_O/V_{REF}=1+(R1/R2)$$

The gain of the amplifier circuit can be modified by varying the ratio between the resistance values R1 and R2.

Figure 2:
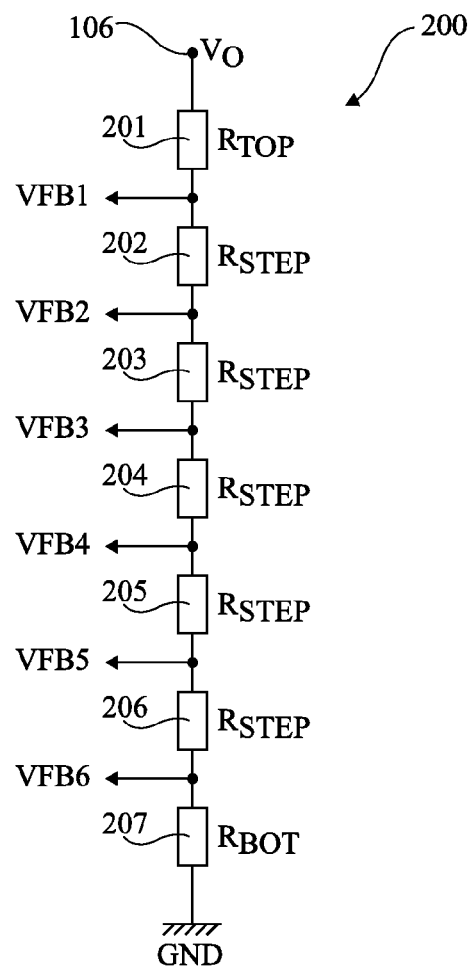
FIG. 2 schematically illustrates an example of a resistive ladder.

FIG. 2 schematically illustrates an example of a resistive ladder 200 that could be used to implement the potential divider 110 of FIG. 1. As illustrated, the resistance ladder 200 comprises seven resistors 201 to 207 coupled in series with each other between the output 106 of the differential amplifier 102 and a ground terminal (GND). The resistor 201 is connected to the output 106 and has a resistance $R_{TOP}$ and the resistor 207 is connected to the ground terminal and has a resistance $R_{BOT}$. The other five intermediate resistors 202 to 206 each have a resistance $R_{STEP}$. Each of the six nodes between the resistors 201 to 207 provides a corresponding voltage level VFB1 to VFB6. By selecting one of these voltages to be provided as the feedback voltage VFB to the negative input of the differential amplifier 102, a particular gain of the amplifier can be selected.

For example, if the voltage level VFB6 between the resistors 206 and 207 is selected as the feedback voltage VFB, the gain will be equal to $1+(R_{TOP}+5R_{STEP})/R_{BOT}$. Alternatively, if the voltage level VFB5 between resistors 205 and 206 is selected as the feedback voltage VFB, the gain will be equal to $1+(R_{TOP}+4R_{STEP})/(R_{STEP}+R_{BOT})$.

While the resistive ladder of FIG. 2 provides a relatively simple solution for varying the resistances R1 and R2 of the potential divider, a drawback is that the step size in the gain will not be constant. In particular, the step size in the gain between selecting the feedback voltage VFBn and VFBn+1, for n between 1 and 5, will vary for different values of n. While this drawback could be overcome by replacing the resistors 202 to 206 of resistance $R_{STEP}$ by resistors having carefully selected resistance values that are each different, this would lead to a broad variation in the resistance values and thus a circuit layout that is far from optimal.

Figure 3:
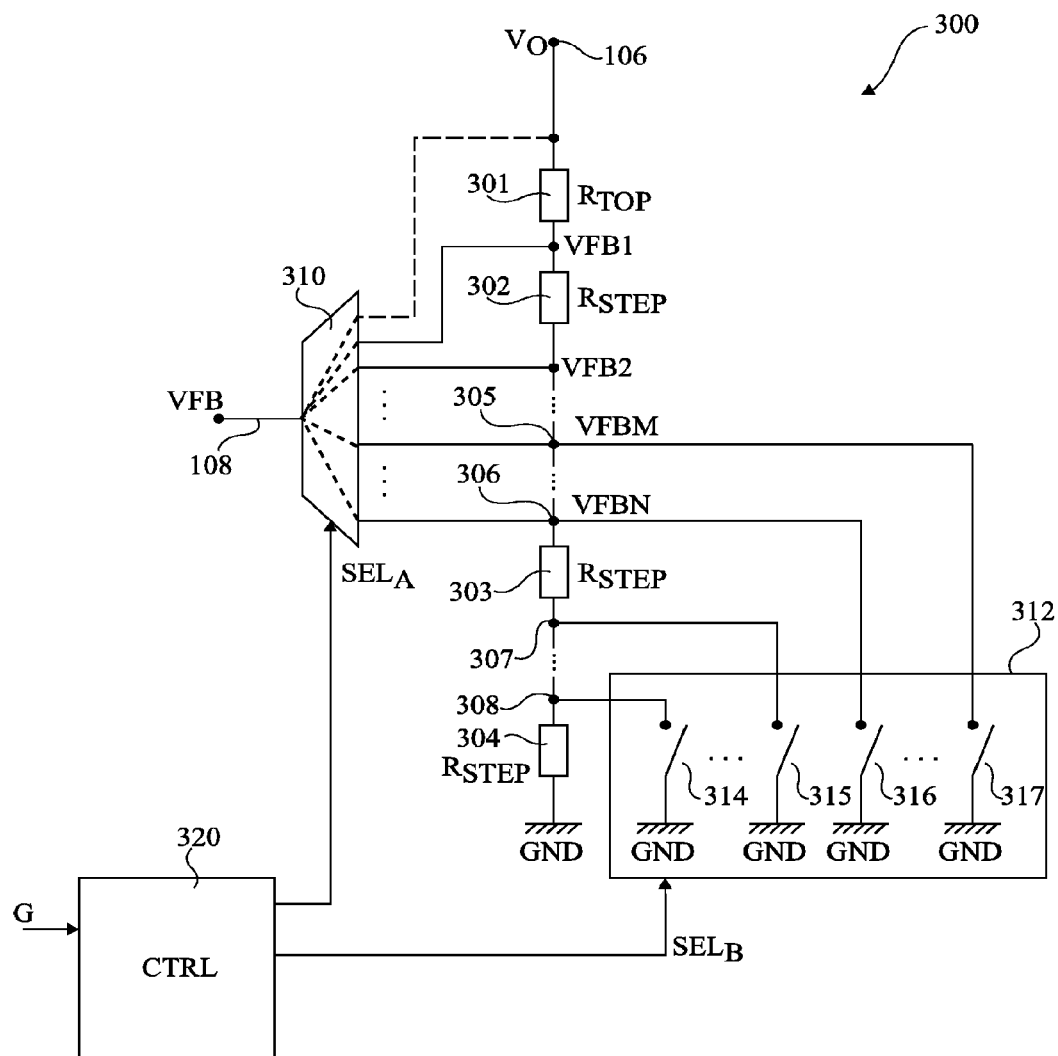
FIG. 3 schematically illustrates a resistive ladder according to an example embodiment of the present disclosure.

FIG. 3 schematically illustrates a resistive ladder 300 according to an example embodiment. In one embodiment, the resistive ladder 300 implements the potential divider 110 of the programmable amplifier circuit 100 of FIG. 1, although other applications would be possible.

As illustrated in FIG. 3, the resistive ladder 300 comprises a number of resistors coupled in series between an input voltage terminal, for example the node 106 providing the voltage $V_O$ at the output of the amplifier circuit of FIG. 1, and a ground terminal. In the example of FIG. 3, four resistors 301 to 304 are illustrated coupled in series. Furthermore, the resistive ladder 300 comprises a voltage selection unit 310, for selecting one of the two or more intermediate nodes between the resistors 301 to 303 to be coupled to the negative input 108 of the differential amplifier 102 of FIG. 1. In the example of FIG. 3, the voltage selection unit 310 is implemented by a multiplexer.

The resistor 301 has a resistance $R_{TOP}$, and one of its nodes is coupled to the node 106. As shown by a dashed line, optionally this node is also coupled to an input of the multiplexer 310. The resistors 302 to 304, and any intermediate resistors between these resistors, each for example have the same resistance value $R_{STEP}$, within a 5 percent tolerance. For example, this means that the resistance of resistance 302 is between 95% and 105% of that of resistor 304. The resistor 302 has one of its nodes coupled to the resistor 301, and its other node coupled to a further node 305, optionally via one or more intermediate resistors as represented by a dotted line. The node 305 is further coupled to a node 306 of the resistor 303, optionally via one or more further intermediate resistors as represented by another dotted line. The other node 307 of resistor 303 is coupled to a node 308 of resistor 304, optionally via one or more intermediate resistors represented by yet another dotted line.

The voltage levels at each of the nodes of resistor 302 are labelled VFB1 and VFB2 respectively, and each is coupled to a corresponding input of the multiplexer 310. The voltage levels at the nodes 305 and 306 are labelled VFBM and VFBN respectively, and are also for example coupled to corresponding inputs of the multiplexer 310. As represented by dots between the input lines of the multiplexer 310, in the case that there are additional resistors between resistors 302 and 303, the multiplexer 310 may comprises further inputs coupled to the corresponding intermediate nodes between these additional resistors.

The resistive ladder 300 further comprises a switch block 312 for selectively coupling one or more of the intermediate nodes between the resistors 302 to 304 to the ground voltage terminal. For example, the switch block 312 comprises a switch 314 coupled between the node 308 and ground. Optionally, the switch block 312 further comprises a switch 315 coupled between the node 307 and ground, a switch 316 coupled between the node 306 and ground, and/or a switch 317 coupled between the node 305 and ground. As represented by dots between the switches 314 and 315, and between the switches 316 to 317, one or more further switches may be provided in the case that there are additional resistors between resistors 302 and 304.

Thus the intermediate nodes between the resistor 301 and the node 305, and the node 305 itself, provide voltage levels VFB1 to VFBM, which are coupled to corresponding inputs of the multiplexer 310. Furthermore, the node 306 and all other intermediate nodes between the node 306 and resistor 304 are coupled by a corresponding switch of the switch block 312 to ground. The nodes 305 and 306, and any intermediate nodes, correspond to overlapping nodes that are for example coupled to both a corresponding input of the multiplexer 310 and to a corresponding switch of the switch block 312.

The resistive ladder 300 further comprises a control block 320 for generating one or more control signals $SEL_A$ for controlling the voltage selection unit 310, and one or more control signals $SEL_B$ for controlling the switch block 312. The control block 320 for example generates the control signals $SEL_A$ and $SEL_B$ based on an input signal G indicating a desired level of the output signal. For example, in the case that the resistive ladder 300 is used as a potential divider 110 of the amplifier circuit 100 of FIG. 1, the signal G indicates a gain to be applied by the circuit.

There are many different possible combinations of the selection signals $SEL_A$ and $SEL_B$ resulting in a broad range of voltage levels at the output. However, the selection signals $SEL_A$ and $SEL_B$ are for example generated such that the resistance R2 between the selected voltage level VFBn and ground remains constant. For example, the lowest feedback signal VFB is for example selected by the multiplexer 310 as the voltage level VFBN at node 306, and in this case all of the switches 314 to 317 are deactivated, so that the resistance R2 is equal to the sum of the resistances of resistors 303 and 304, and any intermediate resistors. This resistance level is for example maintained when any of the other voltage levels VFB1 to VFB(N−1) is selected, by controlling one of the switches of the switch block 312 to bypass an appropriate number of the resistors closest to ground. For example, calling the switches 314 to 317 1 to K, when the voltage level VFB(N−1) is selected, the switch 1 is activated, when the voltage level VFB(N−2) is selected, the switch 2 is activated, etc.

While the resistive ladder 300 is shown as comprising a minimum of four resistors, in its simplest form, two gain levels could be provided using only the three resistors 301, 302 and 304. In such a case, the multiplexer 310 would comprise only two inputs coupled to the voltage levels VFB1 and VFB2, and the switch block 312 would comprise a single switch 314.

The optional connection of the node 106 to an input of the multiplexer 310 as shown by a dashed line in FIG. 3 for example permits a unitary gain of the amplifier circuit to be selected.

Figure 4:
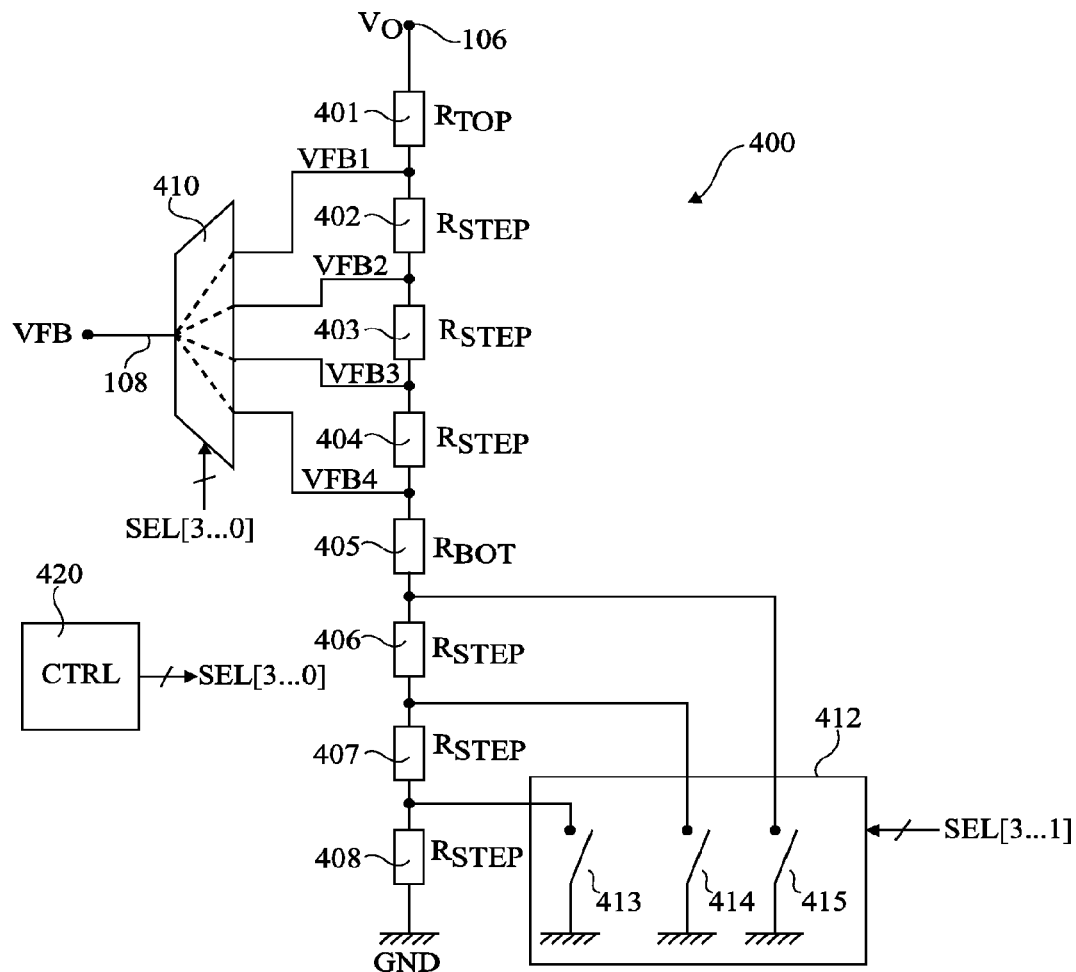
FIG. 4 schematically illustrates a resistive ladder according to a further example embodiment of the present disclosure.

FIG. 4 schematically illustrates a resistive ladder 400 according to a particular example embodiment in the case that there are eight resistors 401 to 408 coupled between the input voltage terminal $V_O$ and the ground terminal. The intermediate nodes between resistors 401 and 405 provide voltage levels VFB1 to VFB4 respectively, and are coupled to corresponding inputs of a 4-input multiplexer 410. A switch block 412 comprises three switches 413 to 415 respectively coupled between the intermediate nodes between resistors 408 to 405 and ground. In the embodiment of FIG. 4 there is no overlap between the nodes coupled to the multiplexer 410 and the nodes connected to the switches of the switch block 412. In such a case, the resistor separating the two groups of resistors, which is resistor 405 in FIG. 4, has a resistance $R_{BOT}$ that is for example different from the resistance $R_{STEP}$ of the other resistors 402 to 404 and 406 to 408.

In the example of FIG. 4, the multiplexer 410 is for example controlled by a 4-bit selection signal SEL[3 . . . 0], in which the code "1000" selects the voltage level VFB1, the code "0100" selects the voltage level VFB2, the code "0010" selects the voltage level VFB3, and the code "0001" selects the voltage level VFB4. The switch block 412 is for example controlled by a 3-bit signal SEL[3 . . . 1] composed of the three most significant bits of the signals SEL[3 . . . 0], in which the code "100" activates the switch 415, the code "010" activates the switch 414, and the code "001" activates the switch 413, and the code "000" does not activate any of the switches 413 to 415. Thus there are four gain levels that may be selected by the selection signal, and for each gain level the resistance R2 between the node 108 and ground is equal to $R_{BOT}+3R_{STEP}$.

Figure 5:
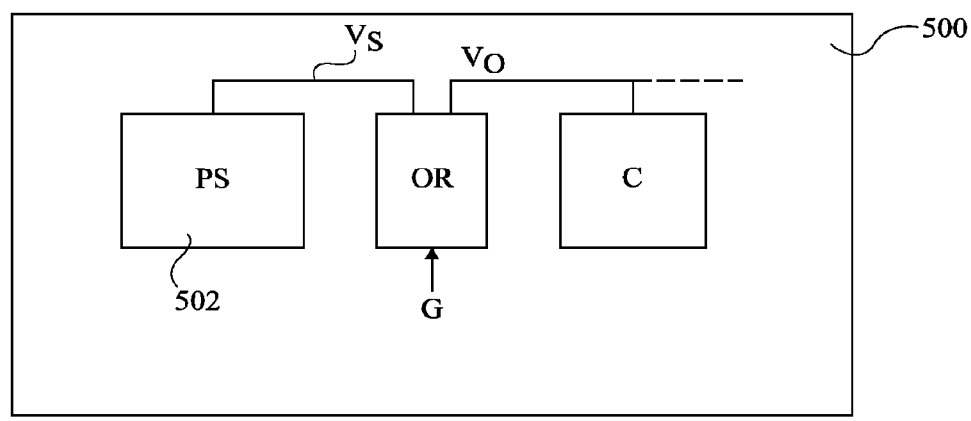
FIG. 5 illustrates an electronic device according to an example embodiment of the present disclosure.

FIG. 5 illustrates an electronic device 500, which is for example an integrated circuit, in which a power source (PS), such as a battery, provides a voltage supply level $V_S$ to an output regulator (OR), which in turn provides an output voltage level $V_O$. The output regulator is for example implemented by the programmable amplifying circuit 100 of FIG. 1, and comprises the resistive ladder 300 of FIG. 3, controlled by a signal G. The control signal G is for example an error signal generated by comparing the output voltage level $V_O$ of the output regulator to a reference level. The output voltage level $V_O$ is for example used to power one or more circuit blocks C of the electronic device.

An advantage of the embodiments described herein is that the output level of a potential divider can be programmed in a simple fashion, with substantially equal step sizes between each level, while permitting the use of resistors having substantially the same resistance. Furthermore, given that each of the switches of the switch block is coupled to the same supply level, e.g. ground, very little noise is introduced when selecting the different voltage levels.

While a number of specific embodiments have been described herein, it will be apparent to those skilled in the art that there are numerous variations and modifications that could be applied.

For example, it will be apparent to those skilled in the art that the ground voltage could be replaced by a voltage level different from 0 V, which could be negative or positive.

The invention claimed is:

1. A resistive ladder comprising:
   first, second, third, and fourth resistors coupled in series between first and second voltage terminals, the first and second resistors being coupled to each other by a first intermediate node, the second and third resistors being coupled to each other by a second intermediate node, and the third and fourth resistors being coupled to each other by a third intermediate node;
   a voltage selection unit having a first input coupled to the first intermediate node and a second input coupled to the second intermediate node, wherein said voltage selection unit is configured to selectively couple one of said first and second inputs to an output node of said resistive ladder;
   a first switch coupled between the third intermediate node and said second voltage terminal; and
   a control circuit configured to control the voltage selection unit and the first switch in a manner that a first resistance between the first intermediate node and the second voltage terminal when the first input node is selected to be coupled to the output node substantially equals a second resistance between the second intermediate node and the second voltage terminal when the second input node is selected to be coupled to the output node.

2. The resistive ladder of claim 1, wherein said second resistor and said third resistor have equal resistances within a 5 percent tolerance.

3. The resistive ladder of claim 1, further comprising:
   a fifth resistor coupled in series with the first, second, third, and fourth resistors, the fifth resistor being positioned between the fourth resistor and the third resistor and coupled to the third resistor by a fourth intermediate node; and
   a second switch coupled between the fourth intermediate node and said second voltage terminal.

4. The resistive ladder of claim 3, comprising at least one further resistor coupled between said third and fifth resistors.

5. The resistive ladder of claim 1, wherein the control circuit is configured to generate one or more control signals for controlling said voltage selection unit and said first switch.

6. The resistive ladder of claim 5, wherein said voltage selection unit comprises a multiplexer having a selection input configured to receive one of said one or more control signals.

7. The resistive ladder of claim 5, wherein said control circuit is configured to select:
   a first voltage level of said resistive ladder by controlling said voltage selection unit to couple said first intermediate node to said output node and activating said first switch; and
   a second voltage level of said resistive ladder by controlling said voltage selection unit to couple said second intermediate node to said output node and deactivating said first switch.

8. A programmable gain amplifier comprising:
   a resistive ladder that includes:
      first, second, third, and fourth resistors coupled in series between first and second voltage terminals, the first and second resistors being coupled to each other by a first intermediate node, the second and third resistors being coupled to each other by a second intermediate node, and the third and fourth resistors being coupled to each other by a third intermediate node;
      a voltage selection unit having a first input coupled to the first intermediate node and a second input coupled to the second intermediate node, wherein said voltage selection unit is configured to selectively couple one of said first and second inputs to an output node of said resistive ladder; and
      a first switch coupled between the third intermediate node and said second voltage terminal;
      a control circuit configured to control the voltage selection unit and the first switch in a manner that a first resistance between the first intermediate node and the second voltage terminal when the first input node is selected to be coupled to the output node substantially equals a second resistance between the second intermediate node and the second voltage terminal when the second input node is selected to be coupled to the output node; and
   a differential amplifier having a non-inverting input node coupled to an input voltage node, an output node coupled to said first voltage terminal of said resistive ladder, and an inverting input node coupled to the output node of the resistive ladder.

9. A method comprising:
   selecting, by a control circuit, a voltage level of a resistive ladder that includes first, second, third, and fourth resistors coupled in series between first and second voltage terminals, the first and second resistors being coupled to each other by a first intermediate node, the second and third resistors being coupled to each other by a second intermediate node, and the third and fourth resistors being coupled to each other by a third intermediate node, wherein said selecting includes:
   selectively coupling a first input of a voltage selection unit to an output node of the voltage selection unit, the first input being coupled to the first intermediate node and selectively coupling a second input of the voltage selection unit to the output node of said resistive ladder, the second input being coupled to the second intermediate node; and
   selectively activating a first switch coupled between the intermediate node and said second voltage terminal, wherein the selectively coupling and selectively activating include controlling the voltage selection unit and the first switch in a manner that a first resistance between the first intermediate node and the second voltage terminal when the first input node is selected to be coupled to the output node substantially eiuals a second resistance between the second intermediate node and the second voltage terminal when the second input node is selected to be coupled to the output node..

10. The method of claim 9, wherein selecting the voltage level comprises selecting a first voltage level by coupling said first intermediate node to said output node and activating said first switch.

11. The method of claim 9, comprising programming a gain of an amplifier circuit, the programming including selecting the voltage level of the resistive ladder.

12. The method of claim 9, wherein selecting the voltage level comprises selecting a second voltage level by coupling said second intermediate node to said output node and deactivating said first switch.

13. The method of claim 9, wherein said second resistor and said third resistor have equal resistances within a 5 percent tolerance.

14. The programmable gain amplifier of claim 8, wherein said second resistor and said third resistor have equal resistances within a 5 percent tolerance.

15. The programmable gain amplifier of claim 8, wherein the resistive ladder includes:
   a fifth resistor coupled in series with the first, second, third, and fourth resistors, the fifth resistor being positioned between the fourth resistor and the third resistor and coupled to the third resistor by a fourth intermediate node; and
   a second switch coupled between the fourth intermediate node and said second voltage terminal.

16. The programmable gain amplifier of claim 8, wherein the resistive ladder includes a control circuit configured to generate one or more control signals controlling said voltage selection unit and said first switch.

17. The programmable gain amplifier of claim 16, wherein said voltage selection unit comprises a multiplexer having a selection input configured to receive one of said one or more control signals.

18. The programmable gain amplifier of claim 16, wherein said control circuit is configured to select:
   a first voltage level of said resistive ladder by controlling said voltage selection unit to couple said first intermediate node to said output node and activating said first switch; and
   a second voltage level of said resistive ladder by controlling said voltage selection unit to couple said second intermediate node to said output node and deactivating said first switch.

19. An electronic device comprising:
   a power source configured to provide a supply voltage; and
   an output regulator configured to receive the supply voltage and provide an output voltage, the output regulator including a resistive ladder that includes:
      first, second, third, and fourth resistors coupled in series between first and second voltage terminals, the first and second resistors being coupled to each other by a first intermediate node, the second and third resistors being coupled to each other by a second intermediate node, and the third and fourth resistors being coupled to each other by a third intermediate node;

a voltage selection unit having a first input coupled to the first intermediate node and a second input coupled to the second intermediate node, wherein said voltage selection unit is configured to selectively couple one of said first and second inputs to an output node of said resistive ladder; and a first switch coupled between the third intermediate node and said second voltage terminal; and a control circuit configured to control the voltage selection unit and the first switch in a manner that a first resistance between the first intermediate node and the second voltage terminal when the first input node is selected to be coupled to the output node substantially eiuals a second resistance between the second intermediate node and the second voltage terminal when the second input node is selected to be coupled to the output node.

20. The electronic device of claim 19, wherein said second resistor and said third resistor have equal resistances within a 5 percent tolerance.

21. The electronic device of claim 19, wherein the resistive ladder includes:
a fifth resistor coupled in series with the first, second, third, and fourth resistors, the fifth resistor being positioned between the fourth resistor and the third resistor and coupled to the third resistor by a fourth intermediate node; and
a second switch coupled between the fourth intermediate node and said second voltage terminal.

22. The electronic device of claim 19, wherein the control circuit is configured to generate one or more control signals controlling said voltage selection unit and said first switch.

23. The electronic device of claim 22, wherein said control circuit is configured to select:
a first voltage level of said resistive ladder by controlling said voltage selection unit to couple said first intermediate node to said output node and activating said first switch; and
a second voltage level of said resistive ladder by controlling said voltage selection unit to couple said second intermediate node to said output node and deactivating said first switch.

* * * * *